United States Patent
Kawaguchi et al.

(10) Patent No.: US 9,444,488 B1
(45) Date of Patent: Sep. 13, 2016

(54) SIGNAL MODULATION CIRCUIT

(71) Applicant: Onkyo Corporation, Osaka (JP)

(72) Inventors: Tsuyoshi Kawaguchi, Osaka (JP);
Yoshinori Nakanishi, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 15/096,910

(22) Filed: Apr. 12, 2016

(30) Foreign Application Priority Data

Apr. 17, 2015 (JP) ................. 2015-085066

(51) Int. Cl.
H03M 3/00 (2006.01)
H04R 3/00 (2006.01)
H04R 3/02 (2006.01)

(52) U.S. Cl.
CPC ............. *H03M 3/358* (2013.01); *H03M 3/32* (2013.01); *H03M 3/422* (2013.01); *H04R 3/007* (2013.01); *H04R 3/02* (2013.01)

(58) Field of Classification Search
CPC ...... H03M 3/30; H03M 3/464; H03M 3/496; H03M 3/454; H03M 3/368; H03M 3/438
USPC ........................................ 341/143
See application file for complete search history.

(56) References Cited

U.S. PATENT DOCUMENTS

| | | | | |
|---|---|---|---|---|
| 6,373,337 B1 * | 4/2002 | Ganser | ................ | H03F 3/45089 330/252 |
| 6,476,673 B2 * | 11/2002 | Takagishi | .............. | H03F 3/2171 330/10 |
| 6,970,123 B1 * | 11/2005 | Sahandiesfanjani | .... | H03F 3/217 341/143 |
| 7,084,799 B1 * | 8/2006 | Butler | ................... | H03F 3/2175 341/143 |
| 7,365,669 B1 * | 4/2008 | Melanson | ............ | G10K 11/178 341/143 |
| 8,000,821 B2 * | 8/2011 | Oddoart | ................ | H03F 3/2173 700/94 |
| 8,106,809 B2 | 1/2012 | Groenewold | | |
| 2005/0200405 A1 * | 9/2005 | Shinohara | ................ | H03F 3/217 330/10 |
| 2007/0202754 A1 * | 8/2007 | Luca | ...................... | H02K 7/006 440/6 |
| 2008/0272946 A1 * | 11/2008 | Melanson | ............ | H02M 1/4225 341/143 |
| 2012/0326904 A1 * | 12/2012 | Jensen | ................... | H03M 3/396 341/131 |
| 2014/0167879 A1 * | 6/2014 | Zhang | ..................... | G06F 13/42 333/125 |

FOREIGN PATENT DOCUMENTS

| | | |
|---|---|---|
| JP | 3369503 B2 | 11/2002 |
| JP | 3625169 B2 | 12/2004 |
| JP | 2007-312258 A | 11/2007 |
| JP | 2012-527187 A | 11/2012 |

* cited by examiner

*Primary Examiner* — Linh Nguyen
(74) *Attorney, Agent, or Firm* — Renner, Otto, Boisselle & Sklar, LLP

(57) ABSTRACT

A signal modulation circuit includes a feedback circuit configured to generate the feedback signal for feeding back a drive signal from a driver circuit to an input signal. The feedback circuit includes at least first and second resistors connected together in series, the second resistor having a higher resistance value than that of the first resistor. One end of the first resistor is connected to a subtracter, and one end of the second resistor is connected to the driver circuit. A first line distance as the line length between one end of the first resistor and the subtracter and a second line distance as the line length between one end of the second resistor and the driver circuit are set shorter than a third line distance as the line length between the other end of the first resistor and the other end of the second resistor.

5 Claims, 6 Drawing Sheets

SIGNAL MODULATION CIRCUIT

BACKGROUND OF THE INVENTION

1. Field of the Invention

The present invention relates to a signal modulation circuit, and particularly relates to a circuit configured to perform delta-sigma modulation.

2. Description of the Related Art

Typically, delta-sigma modulation (ΔΣ modulation) is employed at, e.g., a switching amplifier. A delta-sigma modulator includes a subtracter, an integrator, a quantizer, and a quantization error feedback circuit. The subtracter is configured to calculate the difference between an input signal and a quantized feedback signal. The integrator is configured to integrate a differential signal. The integrated signal is quantized by the quantizer, and is output as a signal of one bit=two values, for example.

JP-A-2007-312258 discloses a delta-sigma modulation circuit including an integrator group, an adder group, a quantizer, and a pulse width revaluation circuit. JP-A-2007-312258 also discloses that after conversion into a one-bit signal synchronized with a sampling clock, the one-bit signal is output. JP-A-2007-312258 further discloses that a D flip-flop is used as the quantizer. Moreover, JP-T-2012-527187 also discloses a delta-sigma modulation circuit.

Japanese Patent No. 3369503 describes that the voltage of a switching signal obtained by pulse amplification of a quantized output signal is reduced by resistive division on a feedback loop for feeding back the switching signal to a delta-sigma modulator, thereby generating a feedback signal. Moreover, in FIG. 8 or 9 of Japanese Patent No. 3625169, it is illustrated that a power amplifier stage positive/negative output waveform of a differential output is directly fed back without resistive division.

In order to feed back, as it is, deformation of the waveform of the switching signal due to, e.g., ripple contained in constant voltage applied to a power amplifier or external noise, it is advantageous that the voltage of the switching signal is reduced by resistive division to generate the feedback signal on the feedback loop for feeding back the switching signal to the delta-sigma modulator. On the other hand, another disadvantage might be caused.

That is, in the case where a resistance value is low in resistive division, if the speaker output voltage driven by the switching signal is high, a component (s) is easily damaged due to a high power consumption and heat generation. This leads to a component size increase. Conversely, when the resistance value is high, there is a disadvantage of lowering performance due to a switching speed decrease. In particular, a printed circuit board pattern on the feedback loop tends to be relatively long as compared to another line. Due to this tendency, attenuation of a high-frequency signal on the feedback loop cannot be ignored, and therefore, the performance is easily lowered.

When the method for directly feeding back the power amplifier stage positive/negative output waveform of the differential output without resistive division is employed, a resistor to ground is not required, and therefore, no current flows through the ground GND. On the other hand, the signal is not attenuated by resistive division. For this reason, there is a disadvantage that a switching waveform of rail-to-rail supply voltage is dragged in a certain pattern, and as a result, noise is easily caused. Moreover, variation in resistance value between two positive and negative feedback paths causes non-linear secondary distortion in delta-sigma modulation. This leads to a worse performance.

SUMMARY OF THE INVENTION

An objective of the present invention is to provide a signal modulation circuit capable of suppressing a power consumption increase and preventing component damage when a feedback signal is generated for a delta-sigma modulator and generating the feedback signal without causing noise which is easily caused when the output of a driver circuit is fed back.

The signal modulation circuit of the present invention is a signal modulation circuit for delta-sigma modulating and outputting an input signal, which includes a subtracter configured to calculate the difference between the input signal and a feedback signal, an integrator configured to integrate an output from the subtracter, a quantizer configured to quantize the signal integrated by the integrator, a driver circuit configured to generate a drive signal for driving a load based on the signal from the quantizer, and a feedback circuit configured to generate the feedback signal for feeding back the drive signal from the driver circuit to the input signal. The feedback circuit includes at least first and second resistors connected together in series, the second resistor having a higher resistance value than that of the first resistor. One end of the first resistor is connected to the subtracter, and one end of the second resistor is connected to the driver circuit. A first line distance as the line length between one end of the first resistor and the subtracter and a second line distance as the line length between one end of the second resistor and the driver circuit are set shorter than a third line distance as the line length between the other end of the first resistor and the other end of the second resistor. The feedback signal is generated from one end of the first resistor.

Preferably, in the signal modulation circuit of the present invention, the feedback circuit is configured such that the resistance value of the second resistor is set equal to or higher than the value obtained by multiplying the resistance value of the first resistor by the gain of the driver circuit.

Preferably, the signal modulation circuit of the present invention further includes a phase inversion circuit configured to invert the phase of the signal integrated by the integrator to output the phase-inverted signal to the quantizer. The quantizer receives the signal integrated by the integrator and the output signal from the phase inversion circuit to output the signal quantized into three or more values to the driver circuit. The feedback circuit further includes at least third and fourth resistors connected together in series, the fourth resistor having a higher resistance value than that of the third resistor. One end of the third resistor is connected to the subtracter, and one end of the fourth resistor is connected to the driver circuit. A fourth line distance as the line length between one end of the third resistor and the subtracter and a fifth line distance as the line length between one end of the fourth resistor and the driver circuit are set shorter than a sixth line distance as the line length between the other end of the third resistor and the other end of the fourth resistor. A second feedback signal is generated from one end of the fourth resistor.

Preferably, in the signal modulation circuit of the present invention, the feedback circuit is configured such that the resistance value of the fourth resistor is set equal to or higher than the value obtained by multiplying the resistance value of the third resistor by the gain of the driver circuit.

Preferably, in the signal modulation circuit of the present invention, the third resistor of the feedback circuit includes a variable resistor element.

Preferably, in the signal modulation circuit of the present invention, the subtracter includes an amplifier with a normal-phase terminal and a reverse-phase terminal, and one end of the third resistor is connected to the reverse-phase terminal.

Preferably, in the signal modulation circuit of the present invention, no low-pass filter is provided between an output of the driver circuit and an output terminal connected to a speaker.

Advantageous effects of the present invention will be described below.

The signal modulation circuit of the present invention includes the feedback circuit configured to generate the feedback signal for feeding back the drive signal from the driver circuit to the input signal. The feedback circuit includes at least the first and second resistors connected together in series, the second resistor having a higher resistance value than that of the first resistor. The feedback signal is generated from one end of the first resistor. One end of the first resistor is connected to the subtracter, and one end of the second resistor is connected to the driver circuit. The first line distance as the line length between one end of the first resistor and the subtracter and the second line distance as the line length between one end of the second resistor and the driver circuit are set shorter than the third line distance as the line length between the other end of the first resistor and the other end of the second resistor.

Thus, the feedback circuit can feed back, to the input signal, the feedback signal obtained by attenuation of the drive signal from the driver circuit. This can prevent component damage. In addition, the first and second resistors connected together in series are arranged such that the second resistor has a higher resistance value than that of the first resistor and that the line length between the first and second resistors is relatively long. Thus, the first line distance as the pattern for dragging the input signal and the second line distance as the pattern for dragging the drive signal with rail-to-rail supply voltage in the driver circuit become shorter. There is an advantage that noise is less caused in the input signal.

Moreover, the signal modulation circuit may further include the phase inversion circuit configured to invert the phase of the signal integrated by the integrator to output the phase-inverted signal to the quantizer. The quantizer may receive the signal integrated by the integrator and the output signal from the phase inversion circuit to output the signal quantized into three or more values to the driver circuit. In this case, the feedback circuit further includes at least the third and fourth resistors connected together in series, the fourth resistor having a higher resistance value than that of the third resistor. The second feedback signal is generated from one end of the fourth resistor. The fourth line distance as the line length between one end of the third resistor and the subtracter and the fifth line distance as the line length between one end of the fourth resistor and the driver circuit are set shorter than the sixth line distance as the line length between the other end of the third resistor and the other end of the fourth resistor. The third resistor may include the variable resistor element.

In this case, the feedback circuit can feed back, to the input signal, the second feedback signal obtained by attenuation of the drive signal output from the driver circuit and having a positive/negative output waveform of a differential output. Similarly, the third and fourth resistors connected together in series are arranged such that the third resistor has a higher resistance value than that of the fourth resistor and that the sixth line distance as the line length between the third and fourth resistors is relatively long. Thus, the fourth line distance as the pattern for dragging the input signal and the fifth line distance as the pattern for dragging the drive signal with the rail-to-rail supply voltage in the driver circuit become shorter. There is an advantage that noise is less caused in the input signal.

Note that the resistance value of the second resistor is preferably set equal to or higher than the value obtained by multiplying the resistance value of the first resistor by the gain of the driver circuit. Similarly, the resistance value of the fourth resistor of the feedback circuit is preferably set equal to or higher than the value obtained by multiplying the resistance value of the third resistor by the gain of the driver circuit. In these cases, noise is less caused in the feedback signal, and improvement can be made such that the distortion factor of the feedback signal is significantly lowered.

With the variable resistor element of the third resistor, the error causing non-linear secondary distortion in delta-sigma modulation can be adjusted even if there is variation in resistance value between the first and third resistors. Thus, there is an advantage that performance is not lowered. Particularly in the case where the subtracter includes the amplifier with the normal-phase terminal and the reverse-phase terminal, one end of the third resistor including the variable resistor element is preferably connected to the reverse-phase terminal. Since the normal-phase terminal is more susceptible to the feedback path, a semi-fixed resistor resulting in a longer line length is preferably provided for a reverse-phase terminal side.

The signal modulation circuit is suitable for the case where no low-pass filter is provided between the output of the driver circuit and the output terminal connected to the speaker. Since the low-pass filter is omitted, the feedback signal is more susceptible to the load of the speaker connected to the driver circuit. However, since the variable resistor element is particularly provided on the path for feeding back the feedback signal as a reverse-phase signal in the third resistor, the symmetry between positive and negative feedback paths can be improved.

According to the signal modulation circuit of the present invention, when the feedback signal is generated, a power consumption increase can be suppressed, and component damage can be prevented. Moreover, the feedback signal can be generated without causing noise which is easily caused when the output of the driver circuit is fed back. Thus, according to the present invention, the load can be driven with a higher efficiency and a higher performance as compared to a typical case.

DETAILED DESCRIPTION OF THE PREFERRED EMBODIMENTS

Signal modulation circuits of preferable embodiments of the present invention will be described below, but the present invention is not limited to such embodiments.

First Embodiment

Figure 1:
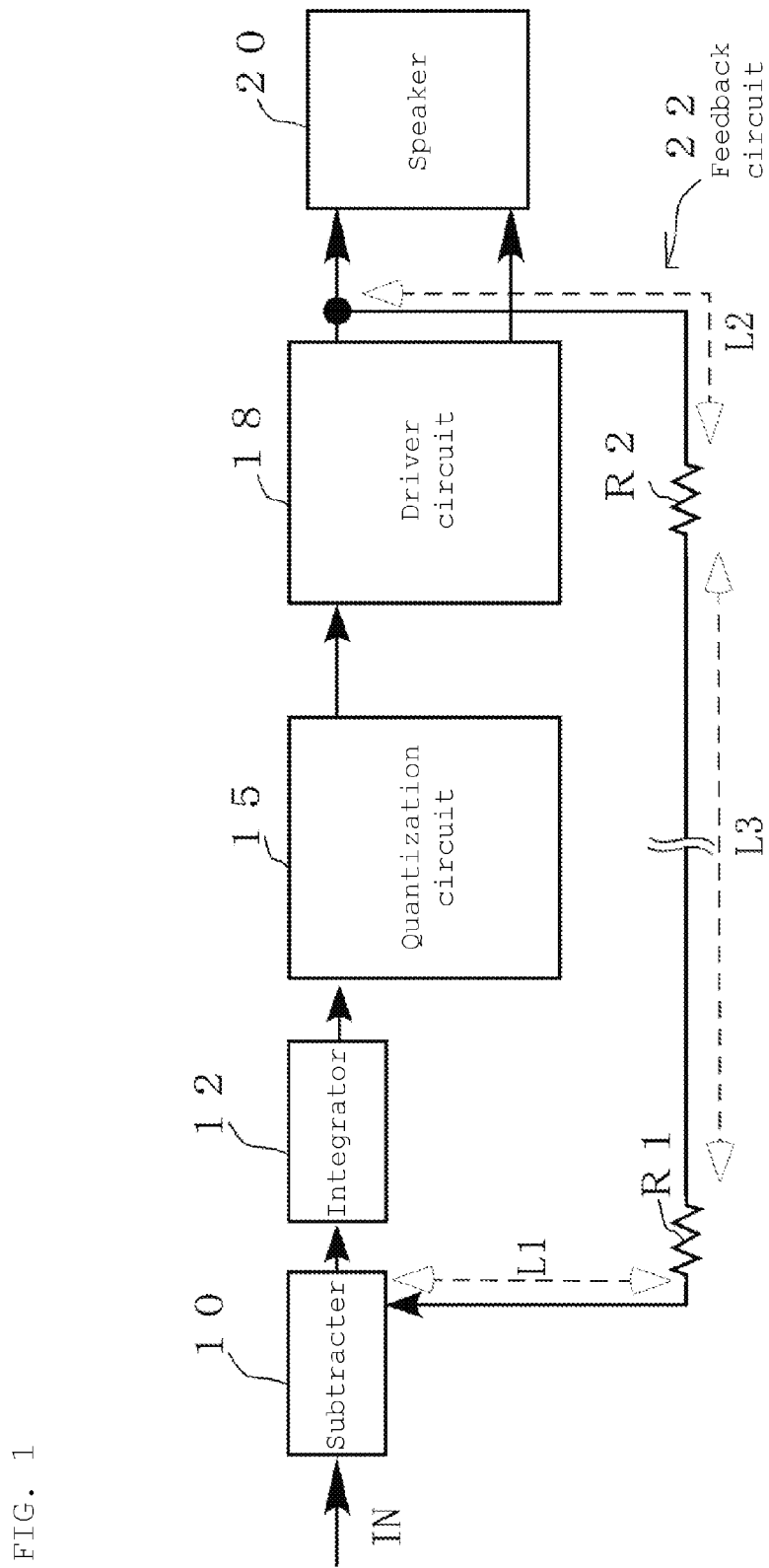
FIG. 1 is a circuit configuration diagram of a first embodiment.

FIG. 1 is a circuit diagram of a signal modulation circuit of a first embodiment. The signal modulation circuit includes a subtracter 10, an integrator 12, a quantization circuit 15, a driver circuit 18, and a feedback circuit 22. The signal modulation circuit is connected to a speaker 20 as a load to drive the speaker 20.

The subtracter 10 is configured to calculate the difference between an input signal and a feedback signal to output such a difference to the integrator 12.

The integrator 12 is configured to integrate the differential signal to output such a signal to the quantization circuit 15. When the signal is output to the quantization circuit 15, a DFF converts the signal into a one-bit digital signal to output the one-bit digital signal. A quantization function is realized by the DFF. In the DFF, a signal can be supplied to a reset terminal such that the output thereof becomes zero. In such a manner that a clock signal is supplied to the reset terminal, a zero level can be inserted at the timing synchronized with the clock signal.

Since the zero level is constantly inserted at the timing synchronized with the clock signal, the output of the DFF becomes the one-bit digital signal of which pulse width is fixed. That is, a signal is output at a rising edge of the input clock signal in the DFF. However, in the case of supplying, e.g., the clock signal delayed and inverted by a delay circuit, a signal is output at a falling edge of the clock signal, and the output of the DFF is reset to the zero level at the following rising edge of the clock signal. This processing is repeated such that the pulse width of the one-bit digital signal becomes equal to that of the clock signal. Thus, the number of pulses with the fixed pulse width can express the magnitude of the input signal.

The quantization circuit 15 is configured to generate a binary waveform signal from the one-bit digital signal from the integrator 12 and the DFF. The driver circuit 18 uses the binary waveform signal from the quantization circuit 15 to drive the speaker 20 as the load. A drive signal from the driver circuit 18 is supplied not only to the speaker 20 but also to the feedback circuit 22.

The feedback circuit 22 is configured to generate the feedback signal by attenuation of the drive signal from the driver circuit 18 to feed back the feedback signal to the subtracter 10. One of characteristic points in FIG. 1 is that the driver circuit 18 is included in a feedback loop. That is, the drive signal from the driver circuit 18 is not only supplied to the speaker 20, but also is, as the feedback signal, fed back to the subtracter 10 via the feedback circuit 22. Thus, in the case of providing the driver circuit 18 outside the feedback loop, distortion of the driver circuit 18 is, as the drive signal, supplied to the speaker 20 as it is. In the present embodiment, distortion of the driver circuit 18 can be also fed back and reduced.

Second Embodiment

Figure 2:
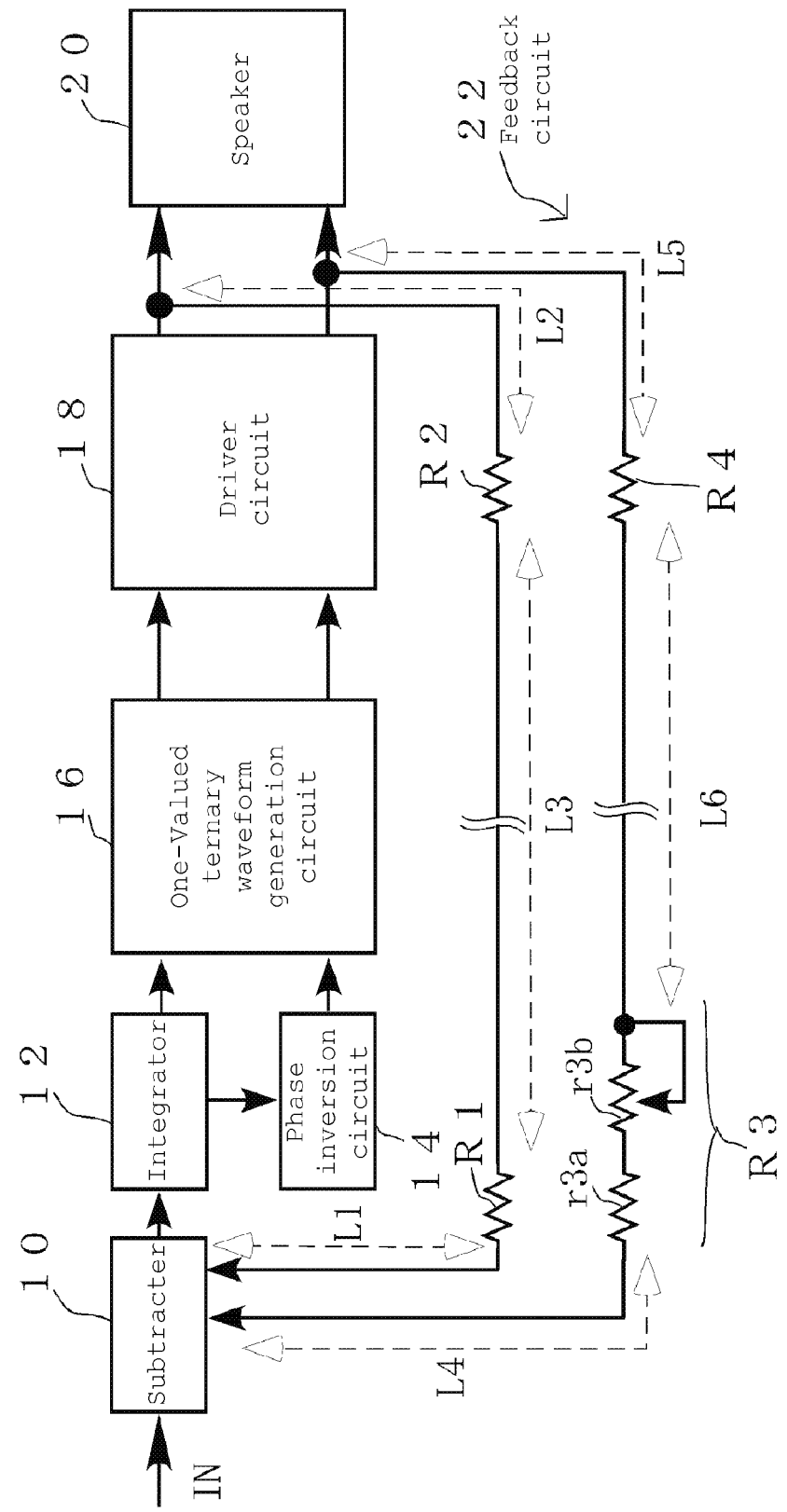
FIG. 2 is a circuit configuration diagram of a second embodiment.

FIG. 2 is a circuit configuration diagram of a signal modulation circuit of a second embodiment. The signal modulation circuit includes a subtracter 10, an integrator 12, a phase inversion circuit 14, a one-valued ternary waveform generation circuit 16, a driver circuit 18, and a feedback circuit 22. The signal modulation circuit is connected to a speaker 20 as a load to drive the speaker 20.

Note that the description overlapping with description of the first embodiment will not be repeated below, and the same reference numerals are used to represent equivalent elements in the second embodiment. Moreover, the second embodiment will be mainly described below.

The phase inversion circuit 14 is configured to invert the phase of the output of the integrator 12 to output the inverted signal to the one-valued ternary waveform generation circuit 16. When the signal is output to the one-valued ternary waveform generation circuit 16, a DFF converts the signal into a one-bit digital signal to output the one-bit digital signal. As described above, a quantization function is realized by the DFF. A clock signal is supplied to a reset terminal so that a zero level can be inserted at the timing synchronized with the clock signal.

The one-valued ternary waveform generation circuit 16 is configured to generate a one-valued ternary waveform signal from a one-bit digital signal from the integrator 12 and a DFF, i.e., a binary signal of +1 and 0, and the one-bit digital signal from the phase inversion circuit 14 and the DFF, i.e., a binary signal of −1 and 0 ("−1" indicates that a signal phase is inverted). The "one-valued ternary" means that three drive states including the state of driving with positive current, the state of driving with negative current, and an OFF state are realized for the load such as the speaker driven by a single power supply. Moreover, the positive and negative currents indicate currents of which flow directions in the load are opposite to each other.

The driver circuit 18 uses the one-valued ternary waveform signal from the one-valued ternary waveform generation circuit 16 to drive the speaker 20 as the load. A drive signal from the driver circuit 18 is supplied not only to the speaker 20 but also to the feedback circuit 22.

The feedback circuit 22 is configured to generate a feedback signal by attenuation of the drive signal from the driver circuit 18 to feed back the feedback signal to the subtracter 10. The feedback circuit 22 directly feeds back, without resistive division, a power amplifier stage positive/negative output waveform of a differential output from the driver circuit 18. Thus, in the present embodiment, distortion of the driver circuit 18 can be also fed back and reduced.

Figure 3:
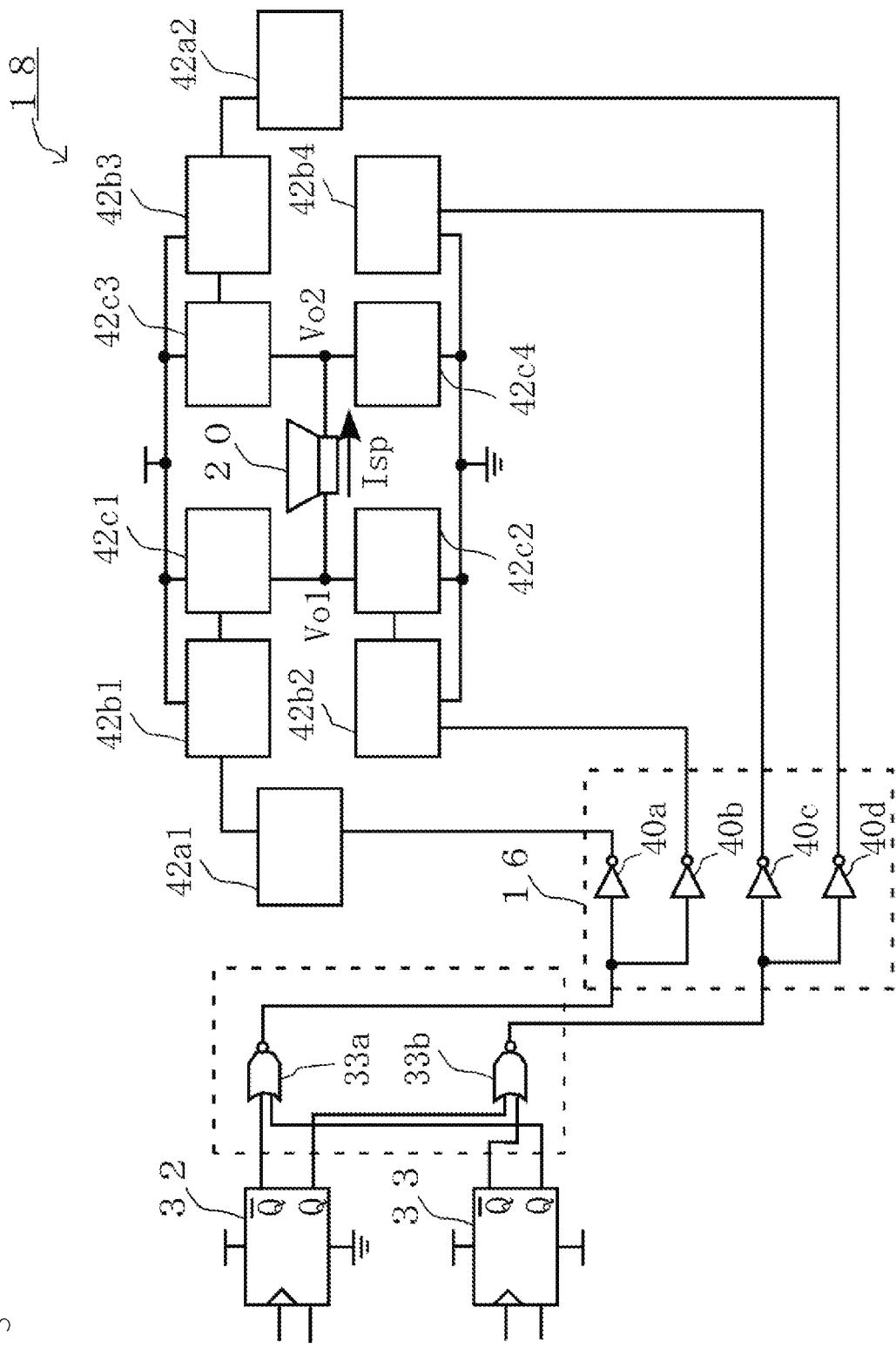
FIG. 3 is a circuit configuration diagram of a one-valued ternary waveform generation circuit and a driver circuit of FIG. 2.

FIG. 3 is a circuit configuration diagram of the one-valued ternary waveform generation circuit 16 and the driver circuit 18. The one-valued ternary waveform generation circuit 16 includes NOR gates 33a, 33b and four NOT gates 40a to 40d. These NOT gates 40a to 40d are referred to as "G11," "G12," "G13," and "G14" in the order from the upper side as viewed in the figure. That is, in the case of referring the NOT gate 40a as "G11," referring the NOT gate 40b as "G12," referring the NOT gate 40c as "G13," and referring the NOT gate 40d as "G14," the output signal of the NOR gate 33a is supplied to the G11 and the G12, and the output signal of the NOR gate 33b is supplied to the G13 and the G14. Each of the G11 to the G14 inverts an input signal to supply an output signal to the driver circuit 18.

The NOR gate 33a is configured to perform logical operation for the following signals: a signal from an inversion output terminal (a Q-bar) of a DFF 32 configured to convert the output of the integrator 12 into the one-bit digital signal; and a signal from an output terminal (Q) of a DFF 33 configured to convert the output of the phase inversion circuit 14 into the one-bit digital signal. The NOR gate 33b is configured to perform logical operation for the following signals and output these signals: a signal from the output terminal (Q) of the DFF 32; and a signal from the inversion output terminal (the Q-bar) of the DFF 33.

The driver circuit 18 includes level shift circuits 42a1, 42a2, gate drive circuits 42b1 to 42b4, and switching FETs 42c1 to 42c4. The switching FETs 42c1, 42c3 are P-channel FETs, and the switching FETs 42c2, 42c4 are N-channel FETs.

One end of the speaker 20 as the load is connected to the connection point between the switching FETs 42c1, 42c2 connected together in series, and the other end of the speaker 20 is connected to the connection point between the switching FETs 42c3, 42c4 connected together in series.

The switching FETs 42c1, 42c3 are connected to a positive electrode side of the single power supply, and the switching FETs 42c2, 42c4 are connected to a negative electrode side of the single power supply. Thus, when the switching FET 42c1 is turned on, the switching FET 42c2 is turned off, the switching FET 42c3 is turned off, and the switching FET 42c4 is turned on, current flows through the switching FET 42c1, the speaker 20, and the switching FET 42c4 in this order. This brings about the positive current ON state.

Moreover, when the switching FET 42c1 is turned off, the switching FET 42c2 is turned on, the switching FET 42c3 is turned on, and the switching FET 42c4 is turned off, current flows through the switching FET 42c3, the speaker, and the switching FET 42c2 in this order. This brings about the negative current ON state.

Further, when the switching FETs 42c1, 42c3 are turned off, and the switching FETs 42c2, 42c4 are turned on, no current flows through the speaker 20. This brings about the OFF state (the OFF state due to short circuit).

The output signals of four logical gates G11 to G14 of the one-valued ternary waveform generation circuit 16 are supplied respectively to the gate drive circuits 42b1 to 42b4 each configured to drive a corresponding one of four switching FETs 42c1 to 42c4. That is, the output signal of the G11 is supplied to the gate drive circuit 42b1 via the level shift circuit 42a1, thereby driving the switching FET 42c1. The output signal of the G12 is supplied to the gate drive circuit 42b2 to drive the switching FET 42c2. The output signal of the G14 is supplied to the gate drive circuit 42b3 via the level shift circuit 42a2, thereby driving the switching FET 42c3. The output signal of the G13 is supplied to the gate drive circuit 42b4 to drive the switching FET 42c4.

In the case where the outputs of the NOR gates 33a, 33b are respectively "1" and "0," the outputs of the G11 and the G12 are inverted from "1" to "0," and the outputs of the G13 and the G14 are inverted from "0" to "1." Then, the switching FET 42c1 is turned on, the switching FET 42c2 is turned off, the switching FET 42c3 is turned off, and the switching FET 42c4 is turned on. Thus, current flows through the switching FET 42c1, the speaker 20, and the switching FET 42c4 in this order (the +ON state).

In the case where the outputs of the NOR gates 33a, 33b are respectively "0" and "1," the outputs of the G11 and the G12 are inverted from "0" to "1," and the outputs of the G13 and the G14 are inverted from "1" to "0." Then, the switching FET 42c1 is turned off, the switching FET 42c2 is turned on, the switching FET 42c3 is turned on, and the switching FET 42c4 is turned off. Thus, current flows through the switching FET 42c3, the speaker 20, and the switching FET 42c2 in this order (the −ON state).

In the case where the outputs of the NOR gates 33a, 33b are "1," the outputs of the G11 to the G14 are inverted from "1" to "0." Then, the switching FET 42c1 is turned on, the switching FET 42c2 is turned off, the switching FET 42c3 is turned on, and the switching FET 42c4 is turned off. Thus, no current flows through the speaker 20 (the OFF state).

In the case where the outputs of the NOR gates 33a, 33b are "0," the outputs of the G11 to the G14 are inverted from "0" to "1." Then, the switching FET 42c1 is turned off, the switching FET 42c2 is turned on, the switching FET 42c3 is turned off, and the switching FET 42c4 is turned on. Thus, no current flows through the speaker 20 (the OFF state).

As described above, the one-valued ternary waveform generation circuit 16 and the driver circuit 18 generate, from a ternary pulse density modulation signal, the ternary signal for driving the speaker at single power supply. Thus, the speaker 20 can be driven without a circuit size increase.

The feedback circuit 22 generates the feedback signal from the drive signal of the driver circuit 18. For example, in the circuit configuration of FIG. 3, a normal-phase feedback signal FB+ is output from the connection point between the switching FET 42c2 and the speaker 20, and a reverse-phase feedback signal FB− is output from the connection point between the switching FET 42c4 and the speaker 20. Both signals are fed back to the subtracter 10.

The feedback circuit 22 of each of the first and second embodiments includes, on the signal path for outputting the feedback signal FB+, resistors R1, R2 connected together in series. The resistance value of the resistor R2 is set at least higher than the resistance value of the resistor R1. One end of the resistor R2 is connected to the driver circuit 18. In the present embodiment, the resistance value of the resistor R2 is, as will be described later, set at least equal to or higher than the value obtained by multiplying the resistance value of the resistor R1 by the gain G of the driver circuit 18. One end of the resistor R1 is connected to the subtracter 10 to generate the feedback signal.

On the signal path for outputting the feedback signal FB+, a line distance L1 as the line length between one end of the resistor R1 and the subtracter 10 and a line distance L2 as the line length between one end of the resistor R2 and the driver circuit 18 are each set shorter than a line distance L3 as the line length between the other end of the resistor R1 and the other end of the resistor R2. That is, since arrangement is made such that the line length between the resistors R1, R2 is relatively long, the resistor R1 and the subtracter 10 are arranged relatively close to each other, and the resistor R2 and the driver circuit 18 are arranged relatively close to each other. Moreover, the resistors R1, R2 are arranged relatively far from each other.

The driver circuit 18 shifts the level of the pulse signal output from the quantization circuit 15 or the one-valued ternary waveform generation circuit 16 to output such a signal. The gain G of the driver circuit 18 is defined as the degree of level shift from an input pulse signal supply voltage of about 1.8 V to 5 V to an output voltage of 20 V to 100 V as an output pulse signal to the speaker 20. Thus, in the feedback circuit 22, the resistance value ratio between the resistors R1, R2 is set higher than the gain G of the driver circuit 18, and therefore, the level of the feedback signal FB+ can be, in the subtracter 10, lowered and attenuated to the same level as that of a quantizer output signal.

Suppose that the supply voltage of the driver circuit 18 is V1, the voltage of the input signal to the subtracter 10 is V2 (V2<V1), and the resistance value ratio between the resistors R1, R2 is 1:10. In a typical case where the gain G of the driver circuit 18 is about 4 to 10, the switched drive signal having passed through the resistor R2 is lowered to the amplitude level represented by an expression of {(V1−V2)/

11+V2}, and then, is input to the subtracter 10. Thus, damage of a component(s) such as the subtracter 10 can be prevented.

As described above, the feedback circuit 22 of the first embodiment inputs the feedback signal FB+ to the subtracter 10, the feedback signal FB+ being obtained by attenuation of the drive signal from the driver circuit 18. Thus, feedback to the input signal can be made. As a result, the line distance L1 as the pattern for dragging the input signal and the line distance L2 as the pattern for dragging the drive signal with rail-to-rail supply voltage in the driver circuit 18 are shortened, and therefore, noise is less caused in the input signal. In particular, improvement can be made to significantly lower the distortion factor of the drive signal in such a manner that the resistance value ratio between the resistors R1, R2 is properly set depending on the gain G of the driver circuit 18.

Moreover, the feedback circuit 22 of the second embodiment further includes, on the signal path for outputting the feedback signal FB−, resistors R3, R4 connected together in series. The resistance value of the resistor R3 is preferably set equal to that of the resistor R1, and the resistance value of the resistor R4 is preferably set equal to that of the resistor R2. Further, the resistor R3 is an element including a fixed resistor r3a and a semi-fixed resistor r3b connected together in series and being capable of finely adjusting the resistance value thereof.

The resistance value of the resistor R4 is set at least higher than the resistance value of the resistor R3. In the present embodiment, the resistance value of the resistor R4 is, as described above, set at least equal to or higher than the value obtained by multiplying the resistance value of the resistor R3 by the gain G of the driver circuit 18. One end of the resistor R4 is connected to the driver circuit 18. In the feedback circuit 22, the resistance value ratio between the resistors R3, R4 is set higher than the gain G of the driver circuit 18, and therefore, the level of the feedback signal FB+ can be, in the subtracter 10, lowered to the same level as that of the quantizer output signal. One end of the resistor R3 is connected to the subtracter 10 to generate the feedback signal.

On the signal path for outputting the feedback signal FB−, a line distance L4 as the line length between one end of the resistor R3 and the subtracter 10 and a line distance L5 as the line length between one end of the resistor R4 and the driver circuit 18 are each set shorter than a line distance L6 as the line length between the other end of the resistor R3 and the other end of the resistor R4. That is, since arrangement is made such that the line length between the resistors R3, R4 is relatively long, the resistor R3 and the subtracter 10 are arranged relatively close to each other, and the resistor R4 and the driver circuit 18 are arranged relatively close to each other. Moreover, the resistors R3, R4 are arranged relatively far from each other.

As described above, the feedback circuit 22 of the second embodiment inputs, separately from the feedback signal FB+ as a normal-phase signal, the feedback signal FB− as a reverse-phase signal to the subtracter 10, the feedback signal FB− being obtained by attenuation of the drive signal from the driver circuit 18. Thus, feedback to the input signal can be made. As a result, the line distance L4 as the pattern for dragging the input signal and the line distance L5 as the pattern for dragging the drive signal with the rail-to-rail supply voltage in the driver circuit 18 are shortened, and therefore, noise is less caused in the input signal.

Figure 4:
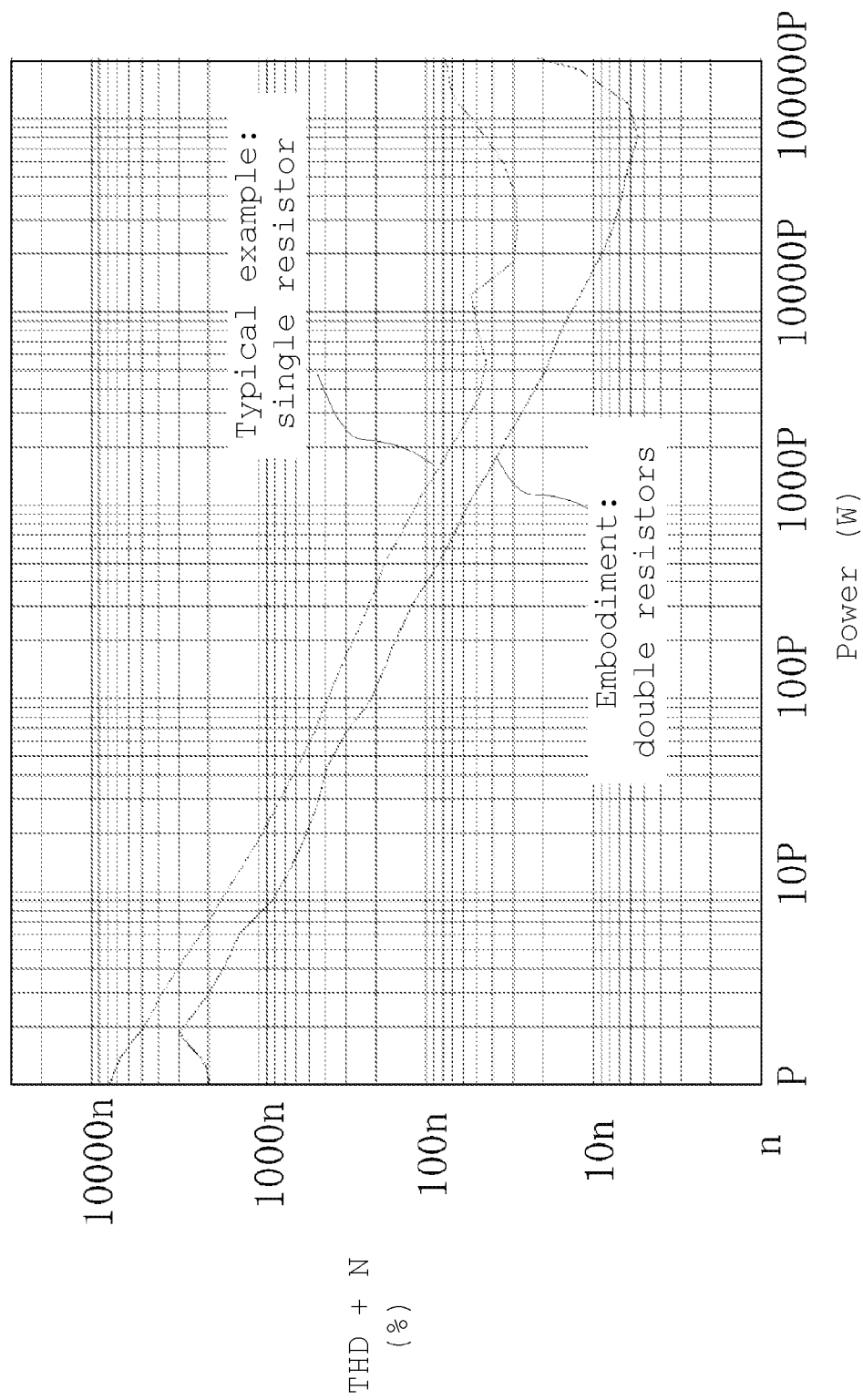
FIG. 4 is a graph for describing harmonic distortion in the second embodiment.

FIG. 4 is a graph for describing harmonic distortion in the second embodiment. Specifically, the horizontal axis of the graph represents the standardized power of the drive signal, and the vertical axis of the graph represents the standardized harmonic distortion factor (%) indicating noise contamination. A lower harmonic distortion factor is preferable regardless of the power. For comparison, a typical case is also shown. In the typical case, the resistors R1, R2 are replaced with a single resistor, the resistors R3, R4 are replaced with a single resistor, and there is no line distance L3 for the resistors R1, R2 being arranged relatively far from each other or no line distance L6 for the resistors R3, R4 being arranged relatively far from each other.

When the resistors are properly arranged in pairs as in the present embodiment, the harmonic distortion is reduced across the entire power range, leading to performance improvement. The same applies to the first embodiment.

On the other hand, in the case where the resistors R1, R2 are merely replaced with the single resistor, the resistors R3, R4 are merely replaced with the single resistor, and these resistors are connected together, when the resistance values of these resistors are low, if the speaker output voltage driven by a switching signal is high, there is a disadvantage that heat generation and a component size increase are caused due to a power consumption increase. Conversely, when the resistance values are high, there is a disadvantage that performance is lowered due to a switching speed decrease. Thus, in the feedback circuit 22 of the present embodiment, the resistors R1 to R4 are properly set and connected as illustrated in FIG. 2, and therefore, a switching speed decrease, particularly lowering of transient response characteristics, can be suppressed even if the resistance values are relatively high.

Each of the line distances L1 to L6 may be determined depending on the length of the pattern/line connecting between input and output terminals of resistor elements or circuits, or may be determined depending on the spatial distance between certain points defining the positions of the resistor elements or the circuits. That is, each of the line distances L1 to L6 may be defined such that the relative spacing between the resistor elements or the circuits is determined. As a result, the resistors R1, R3 are arranged relatively close to the subtracter 10. Similarly, each of the line distances L1 to L6 may be defined such that the resistors R2, R4 are obviously arranged relatively close to the driver circuit 18, that the resistors R1, R2 are obviously arranged relatively far from each other, and that the resistors R3, R4 are obviously arranged relatively far from each other.

Figure 5:
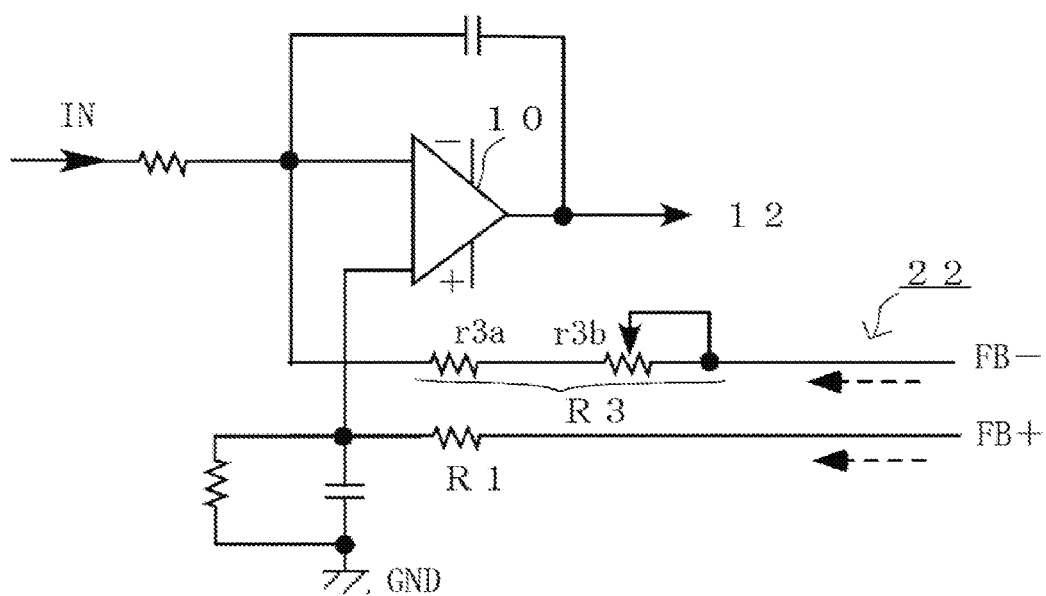
FIG. 5 is a circuit configuration diagram of a subtracter and a feedback circuit of FIG. 2.

FIG. 5 is a circuit diagram of the subtracter 10 and the feedback circuit 22 in the second embodiment. The subtracter 10 is formed of an operational amplifier with a normal-phase terminal and a reverse-phase terminal. In the feedback circuit 22 illustrated in FIG. 5, the resistor R1 as a first resistor disposed close to the subtracter 10 is connected to the normal-phase terminal of the subtracter 10 configured to feed back the feedback signal FB+ as the normal-phase signal, and the resistor R3 as a third resistor including the semi-fixed resistor r3b is connected to the reverse-phase terminal of the subtracter 10 configured to feed back the feedback signal FB− as the reverse-phase signal. Note that in the feedback circuit 22 illustrated in FIG. 5, the resistors R2, R4 arranged relatively far from the subtracter 10 are not shown.

The output of the operational amplifier as the subtracter 10 is output to the integrator 12, and together with the feedback signal FB−, is fed back to the input signal IN via a capacitor. That is, in comparison between a reception impedance on a reverse-phase signal side and reception impedance on a normal-phase signal side, the capacitor is on the feedback path of the operational amplifier, and therefore, the reception impedance on the reverse-phase signal side is lower. Because of circuit loop enlargement due to the housing size of the semi-fixed resistor, the semi-fixed resistor is susceptible to noise. However, with a lower reception impedance, the influence of the noise on the semi-fixed resistor can be reduced. Thus, as illustrated in FIG. 5, the resistor R3 including the semi-fixed resistor r3b in the feedback circuit 22 is preferably provided on the path for feeding back the feedback signal FB− as the reverse-phase signal.

Figure 6:
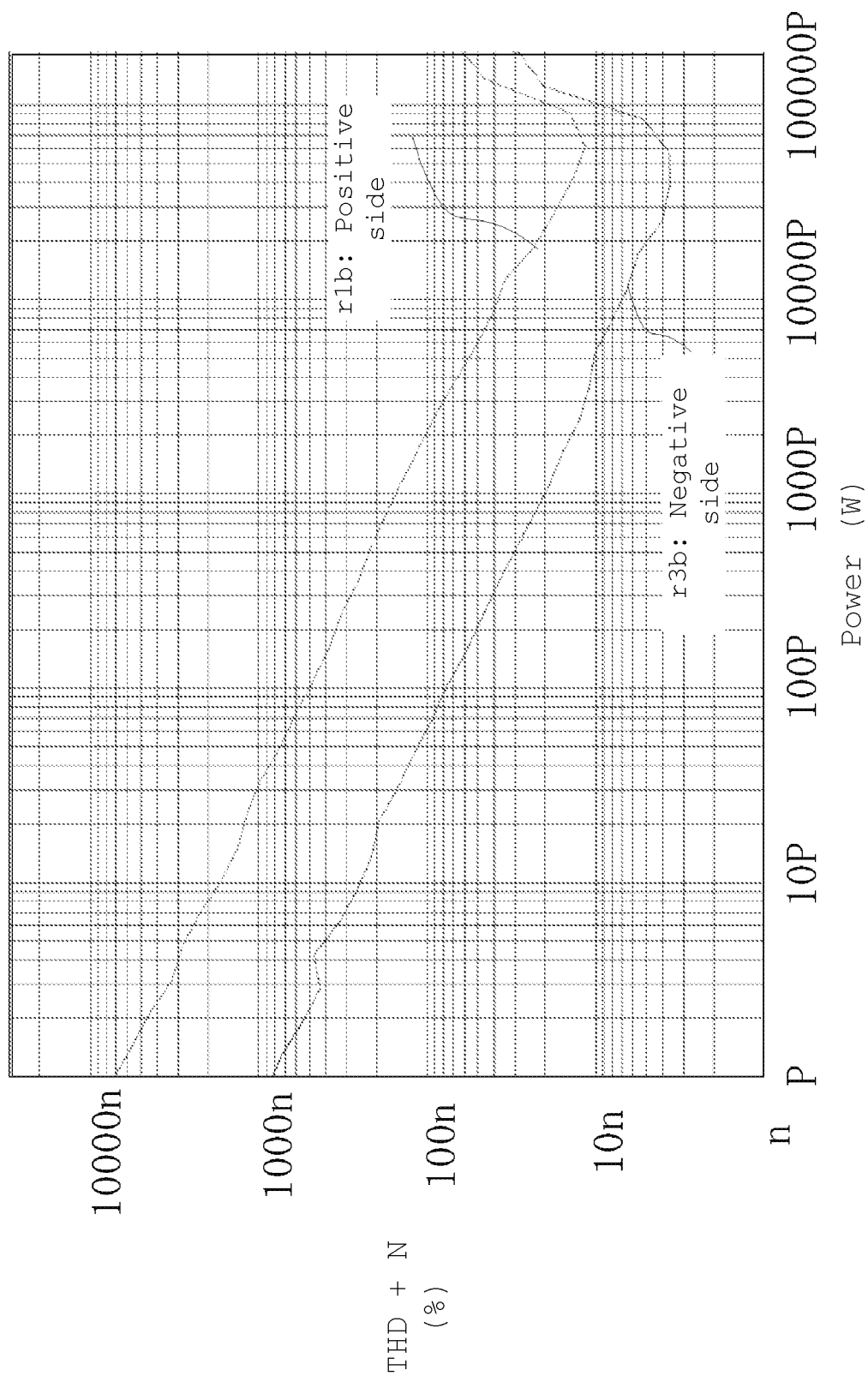
FIG. 6 is a graph for describing the harmonic distortion in the second embodiment.

FIG. 6 is a graph for describing the harmonic distortion in the second embodiment. Specifically, as shown in FIG. 4, the horizontal axis of the graph represents the standardized power of the drive signal, and the vertical axis of the graph represents the standardized harmonic distortion factor (%) indicating noise contamination. The graph shows the following cases for comparison: the case of properly providing and adjusting the semi-fixed resistor r3b of the resistor R3 on the path for feeding back the feedback signal FB− as the reverse-phase signal (r3b: a negative side); and for comparison, the case of proving no semi-fixed resistor r3b of the resistor R3 and inserting and providing a semi-fixed resistor r1b (not shown) on the path for feeding back the feedback signal FB+ as the normal-phase signal (rib: positive side).

In the present embodiment, an error component between the feedback signal FB+ as the normal-phase signal and the feedback signal FB− as the reverse-phase signal is corrected by adjustment of the semi-fixed resistor r3b of the resistor R3, and as a result, the harmonic distortion can be reduced across the entire power range. The error between the feedback signal FB+ and the feedback signal FB− is, as it is, reflected in non-liner secondary distortion in delta-sigma modulation. In the case of providing the semi-fixed resistor r1b on the path for feeding back the feedback signal FB+, noise is caused.

On the other hand, when the semi-fixed resistor r3b of the resistor R3 is provided on the path for feeding back the feedback signal FB− as the reverse-phase signal, the symmetry between the positive and negative feedback paths can be improved. Thus, in the present embodiment, the harmonic distortion factor can be improved by about 20 dB as compared to the typical case. The harmonic distortion is reduced across the entire power range, leading to performance improvement. In the present embodiment, the speaker 20 can be driven with a higher performance.

Note that in the case where a low-pass filter for removing a carrier signal is employed in a switching amplifier using a signal modulation circuit for delta-sigma modulation as described in the present embodiment, an LC filter including a coil and a capacitor is often used. However, in an LC filter for a high voltage value and a high current value, the size of a coil/capacitor is large. For this reason, the area of the LC filter in a substrate of a switching amplifier of which size has been increasingly reduced is large. This leads to the disadvantage that such a large area becomes a bottleneck in size reduction. Moreover, the large coil/capacitor is disadvantageous in a manufacturing cost. For this reason, it has been required for a speaker device including a switching amplifier connected to an electrodynamic speaker that a low-pass filter can be omitted or that a LC filter with a small coil/capacitor is realized.

The signal modulation circuit of the present embodiment is applicable to the case where the low-pass filter is omitted. In the signal modulation circuit illustrated in FIGS. 1 to 3, no low-pass filter is provided between the output of the driver circuit 18 and the output terminal (not clearly indicated by a reference numeral) connected to the speaker 20. Without the low-pass filter, the influence of the load of the speaker connected to the drive circuit on the feedback signal is easily exhibited. However, since the semi-fixed resistor r3b of the resistor R3 is provided on the path for feeding back the feedback signal FB− as the reverse-phase signal, the symmetry between the positive and negative feedback paths can be improved.

The embodiments of the present invention have been described above, but the present invention is not limited to these embodiments. Variations can be made.

For example, in the present embodiment, the DFF is provided as the quantizer. Instead, the quantizer may include a chopper circuit and the DFF. In such a manner that ON/OFF of switching of the chopper circuit is controlled by the clock signal, the one-bit digital signal can be generated while the zero level is inserted at the timing synchronized with the clock signal.

In the present embodiment, the signal modulation circuit as illustrated in FIGS. 1 to 3 and FIG. 5 has been described. However, such a signal modulation circuit has been described merely as an example. The present invention is applicable to an optional circuit configuration for generating a feedback signal from a drive signal (a drive voltage signal) of a speaker 20.

The signal modulation circuit of the present invention is applicable not only to a stereo device configured to reproduce the contents containing an analog sound signal or a digital sound signal and including an amplifier and a speaker, or a multi-channel surrounding sound reproduction device, but also to, e.g., video sound equipment such as a display.

What is claimed is:

1. A signal modulation circuit for delta-sigma modulating and outputting an input signal, comprising:
    a subtracter configured to calculate a difference between the input signal and a feedback signal;
    an integrator configured to integrate an output from the subtracter;
    a quantizer configured to quantize a signal integrated by the integrator;
    a driver circuit configured to generate a drive signal for driving a load based on the signal from the quantizer; and
    a feedback circuit configured to generate the feedback signal for feeding back the drive signal from the driver circuit to the input signal,
    wherein the feedback circuit includes at least first and second resistors connected together in series, the second resistor having a higher resistance value than that of the first resistor,
    one end of the first resistor is connected to the subtracter, and one end of the second resistor is connected to the driver circuit,
    a first line distance as a line length between the one end of the first resistor and the subtracter and a second line distance as a line length between the one end of the second resistor and the driver circuit are set shorter than a third line distance as a line length between the other end of the first resistor and the other end of the second resistor, and
    the feedback signal is generated from the one end of the first resistor, and
    further comprising:
    a phase inversion circuit configured to invert a phase of the signal integrated by the integrator to output the phase-inverted signal to the quantizer, wherein the quantizer receives the signal integrated by the integrator and the output signal from the phase inversion circuit to output a signal quantized into three or more values to the driver circuit, the feedback circuit further includes at least third and fourth resistors connected together in series, the fourth resistor having a higher resistance value than that of the third resistor, one end of the third resistor is connected to the subtracter, and one end of the fourth resistor is connected to the driver circuit, a fourth line distance as a line length between the one end of the third resistor and the subtracter and a fifth line distance as a line length between the one end of the fourth resistor and the driver circuit are set shorter than a sixth line distance as a line length between the other end of the third resistor and the other end of the fourth resistor, and a second feedback signal is generated from the one end of the fourth resistor.

2. The signal modulation circuit according to claim 1, wherein the feedback circuit is configured such that the resistance value of the fourth resistor is set equal to or higher than a value obtained by multiplying the resistance value of the third resistor by the gain of the driver circuit.

3. The signal modulation circuit according to claim 1, wherein the third resistor of the feedback circuit includes a variable resistor element.

4. The signal modulation circuit according to claim 3, wherein the subtracter includes an amplifier with a normal-phase terminal and a reverse-phase terminal, and the one end of the third resistor is connected to the reverse-phase terminal.

5. The signal modulation circuit according to claim 1, wherein no low-pass filter is provided between an output of the driver circuit and an output terminal connected to a speaker.

* * * * *